(12) United States Patent
Strickling et al.

(10) Patent No.: US 12,055,603 B2
(45) Date of Patent: Aug. 6, 2024

(54) CABLE CONDITION INDICATOR

(71) Applicant: Tektronix, Inc., Beaverton, OR (US)

(72) Inventors: Sam J. Strickling, Portland, OR (US);
Daniel S. Froelich, Portland, OR (US);
Michelle L. Baldwin, Mount Juliet, TN (US); Jonathan San, Palo Alto, CA (US); Lin-Yung Chen, New Taipei (TW)

(73) Assignee: Tektronix, Inc., Beaverton, OR (US)

( * ) Notice: Subject to any disclaimer, the term of this patent is extended or adjusted under 35 U.S.C. 154(b) by 453 days.

(21) Appl. No.: 17/386,384

(22) Filed: Jul. 27, 2021

(65) Prior Publication Data

US 2022/0034975 A1 Feb. 3, 2022

Related U.S. Application Data

(60) Provisional application No. 63/060,010, filed on Aug. 1, 2020.

(51) Int. Cl.
| | | |
|---|---|---|
| *G08B 21/00* | (2006.01) | |
| *G01R 31/12* | (2020.01) | |
| *G01R 31/58* | (2020.01) | |
| *H01R 13/64* | (2006.01) | |
| *H01R 13/66* | (2006.01) | |

(52) U.S. Cl.
CPC ......... *G01R 31/58* (2020.01); *G01R 31/1218* (2013.01); *H01R 13/64* (2013.01); *H01R 13/6675* (2013.01)

(58) Field of Classification Search
CPC .... G01R 31/58; G01R 31/1218; H01R 13/64; H01R 13/6675
USPC ....................................................... 340/652
See application file for complete search history.

(56) References Cited

U.S. PATENT DOCUMENTS

| | | | | |
|---|---|---|---|---|
| 2014/0005491 A1* | 1/2014 | Huiku | .................. | A61B 5/7221 |
| | | | | 600/300 |
| 2014/0347070 A1* | 11/2014 | Scheuschner | .......... | G01R 31/08 |
| | | | | 324/543 |
| 2017/0016936 A1* | 1/2017 | Patel | .................. | G01R 19/0046 |
| 2019/0218902 A1* | 7/2019 | Demick | ................ | E21B 19/084 |
| 2020/0096550 A1* | 3/2020 | Goergen | .............. | G01R 31/088 |
| 2020/0106296 A1* | 4/2020 | Andle | ....................... | H04B 5/77 |
| 2021/0344184 A1* | 11/2021 | Gundel | .................. | G01R 31/58 |
| 2023/0302267 A1* | 9/2023 | Finch, Jr. | .......... | A61M 39/0247 |

* cited by examiner

*Primary Examiner* — Naomi J Small
(74) *Attorney, Agent, or Firm* — Miller Nash LLP; Andrew J. Harrington; Krista Y. Chan (57) ABSTRACT

A cable structured to be repeatedly connected to a device, each repeated connection causing degradation of the cable, the cable including a condition indicator disposed on the cable and configured to be updated with each successive connection of the cable into the device.

24 Claims, 5 Drawing Sheets

CABLE CONDITION INDICATOR

PRIORITY

This disclosure claims benefit of U.S. Provisional Application No. 63/060,010, titled "MUX-ENABLED CABLES AND TEST FIXTURES," filed on Aug. 1, 2020, the disclosure of which is incorporated herein by reference in its entirety.

TECHNICAL FIELD

This disclosure relates to test and measurement systems for measuring one or more signals from a device under test (DUT) through one or more cables, and in particular, to managing electrical cable and/or fixture health for at least one of the one or more cables.

BACKGROUND

Conventional testing of DUTs often requires connecting a test and measurement instrument to a DUT, usually by a test cable or probe. However, these physical cables and test probes are often the most used and worn-out piece of equipment within a test system. Worn out cables may not perform as originally designed and can caused errors and inaccuracies within a test system. However, many of these worn cables may not readily show signs of wear so a user may not be aware that their test setup may cause errors and inconsistencies in the results leading to significant time spent undoing errors.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

Disclosed herein is a test and measurement system with a cable that is repeatedly inserted into or connected to a device, such a test and measurement instrument and/or a DUT. The test and measurement system can include a cable condition indicator, either disposed on the cable itself or within a test and measurement instrument, that is updated with each successive insertion of the cable into a device.

Figure 1:
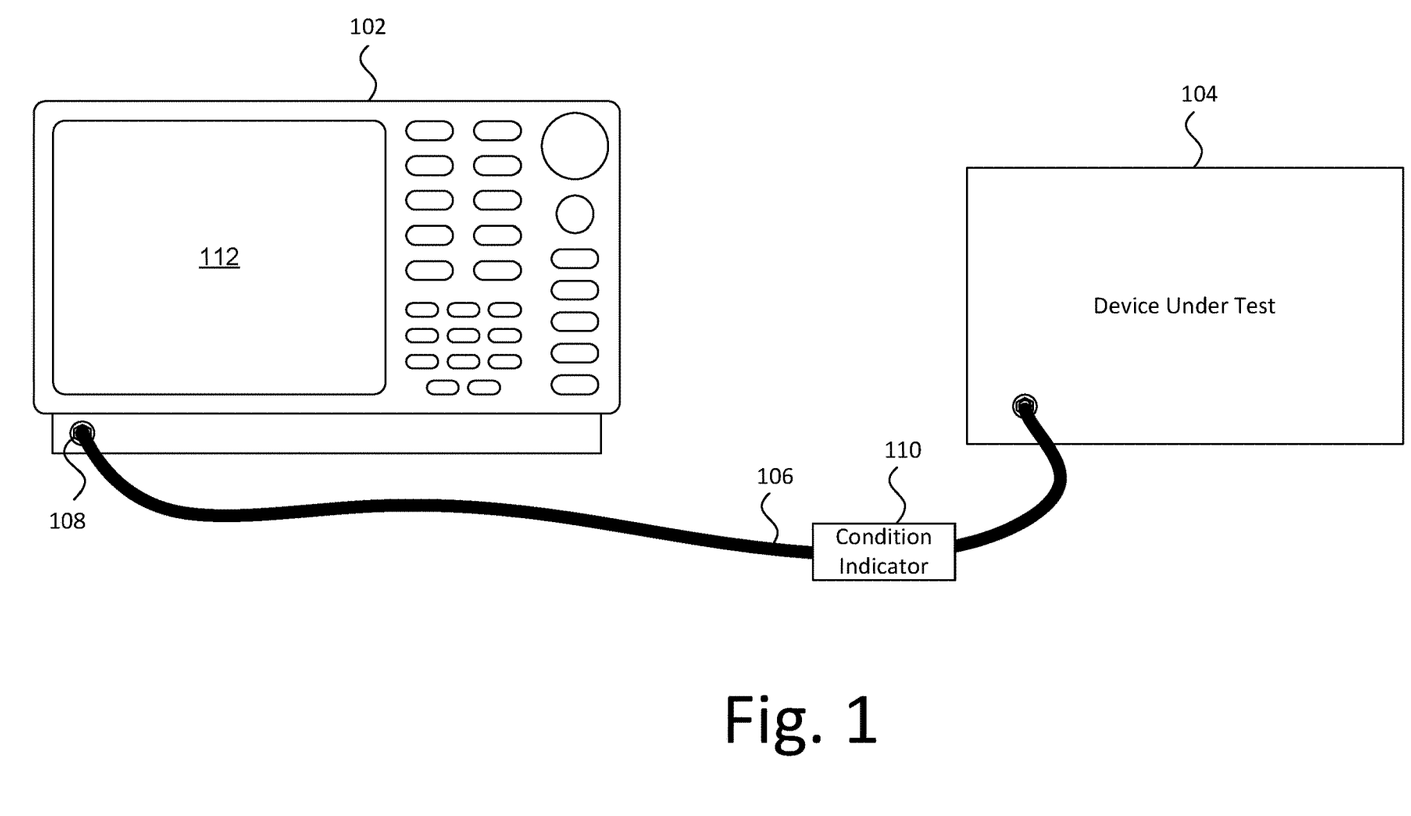
FIG. 1 is diagram of a test and measurement system.

FIG. 1 illustrates an example test and measurement system according to some examples of the disclosure. The test and measurement system 100 may include a test and measurement device 102, such as, but not limited to, an oscilloscope, a vector network analyzer, a margin tester, a bit error rate tester (BERT), etc. The test and measurement instrument 102 can include a display 112. The test and measurement device 102 can be connected to a DUT 104 by one or more cables or probes 106. In FIG. 1, the cable 106 is connected to an input port 108 of a test and measurement instrument.

While a coaxial cable 106 is shown in FIG. 1, cables and probes are not limited to these types of cables, and any cable may be used, such as, but not limited to, high-density cables, plug cables, barrel cables, voltage and/or current probe, etc. Any cable or probe that is repeatedly inserted into a device, such as a test and measurement device 102 and/or DUT 104 may be used.

The cable 106 can include a condition indicator 110. The condition indicator 108 can be any mechanism for indicating the condition, or health, of the cable 106. For example, the condition indicator may be a mechanical condition indicator, which can count the number of times the cable 106 has been inserted into a device, a wear indicator, or on-board electronic condition indicator. While a single condition indicator 108 is shown in FIG. 1, in some examples, a condition indicator 108 may be provided on each end of the cable or connector/adapter 106. The condition indicator 110 may be located on or within a connector or cable assembly of the cable 106.

Figure 2:
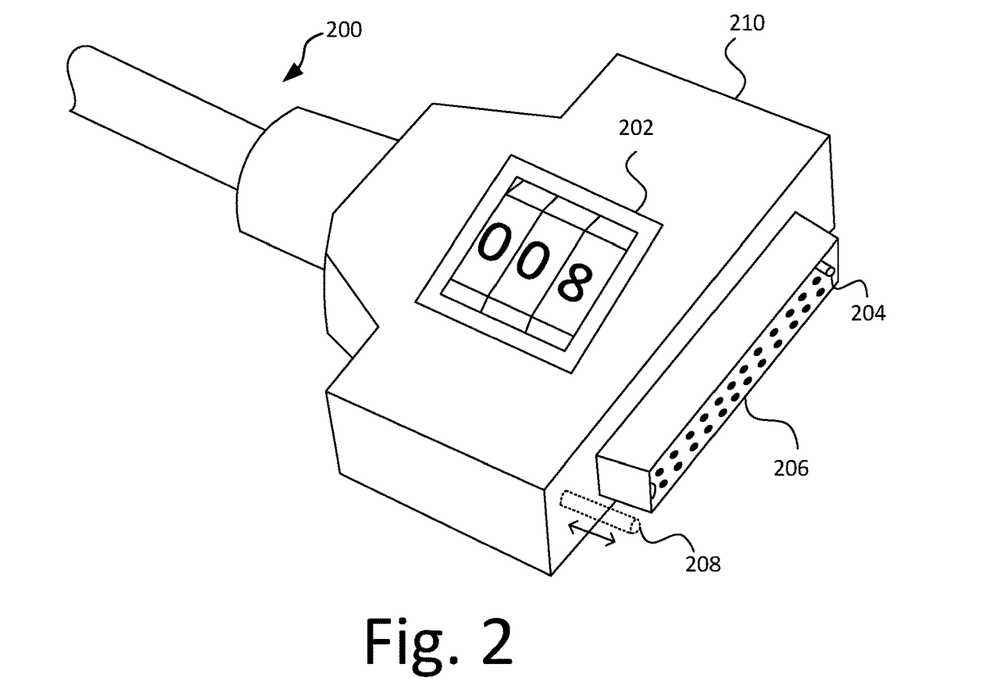
FIG. 2 illustrates a connector of a cable according to some examples of the disclosure.

FIG. 2 illustrates an example of a mechanical condition indicator according to some examples of the disclosure. FIG. 2 illustrates an end-portion of a high-density cable 200. However, as will be understood by one skilled in the art, the mechanical condition indicator of FIG. 2 is not limited to high-density cables and may be used on any cable connector or cable assembly.

In this example, the mechanical condition indicator 202 includes a mechanical wheel, such as a number wheel. The mechanical condition indicator 202 can roll over to a new number each time the cable is plugged into a device. In some examples, the color of the numbers may change to show the remaining useful life of the cable 200. The numbers on the mechanical condition indicator 202 may start out green and change colors as the cable 200 is successively inserted to red. For example, the numbers may change from green, orange, to red, with red indicating the cable 200 is worn and should be replaced. Any number of colors may be used.

In some examples, rather than counting up, the mechanical condition indicator 202 may count down to zero to indicate for how many more insertions the cable 202 is rated. However, in both examples, the mechanical condition indicator 202 is adjusted based on each successive insertion of the cable 202 into a device. Allowing a user to see the number of insertions of the cable 200 may provide helpful information, such as being able to certify test results of a device under test. While a number wheel is shown, numbers do not need to be displayed on the wheel and only colors of the wheel may change each time the cable 200 is inserted into a device.

The condition indicator 202 may rotate when a pin 204 is depressed. For example, pin 204 may be pushed inward when the cable interface 206 is inserted into a device. The depression of the pin 204 can cause the condition indicator 202 to update with each new insertion. While the pin 204 is shown within the interface 206 of the cable 200, the pin 204 may be located anywhere on the connector 210 that allows the pin 204 to be depressed when the interface 206 is inserted into a device.

Examples of the disclosure, however, are not limited to a mechanical condition indicator 202 and a pin 204 as shown in FIG. 2. For example, the condition indicator 202 may be a digital screen that can output the number of times the cable 200 has been inserted into a device.

Rather than a mechanical pin 204, sensors may be provided on one of the test and measurement instrument tor the cable 200. The sensors can sense when the cable has been inserted into the device, causing the condition indicator 202 to increase or decrease. Examples of such sensors may be optical sensors, Hall Effect sensor and a magnet, etc. Any sensor that can sense that the cable 200 has been inserted into a test and measurement instrument may be used.

In some examples, the connector 210 may include an optional blocking mechanism 208 that is extended when the cable 200 is at the end of life. For example, when the condition indicator 202 has reached a certain number of insertions, a blocking mechanism 208, such as a pin, as shown in FIG. 2, may be extended from the face of the connector 210 to prevent the interface 206 from being inserted into the device.

While the blocking mechanism 208 is shown on the side of the interface 206, the blocking mechanism 208 may be placed in any location on the cable connector interface 206 that prevents the interface 206 from being inserted into a device. For example, the blocking mechanism 208 could include a bar that extends outward directly from the interface 206 or may extend across the interface 206 to prevent the interface 206 from being inserted into the device. In other examples, the blocking mechanism 208 may include a telescoping cover that may be extended from either a top or bottom surface of the interface 206 to prevent the insertion of the cable 200 into the device.

In some examples, the blocking mechanism 208 may be one or more retracing pin(s) that do not allow for mating to occur between the cable 200 and the interface 206. In other examples, the blocking mechanism 208 may not be a physical blocking mechanism but may be a digital blocking mechanism. A processor of a test and measurement instrument 102 can prevent measurements from being taken using the cable 106.

Figure 3:
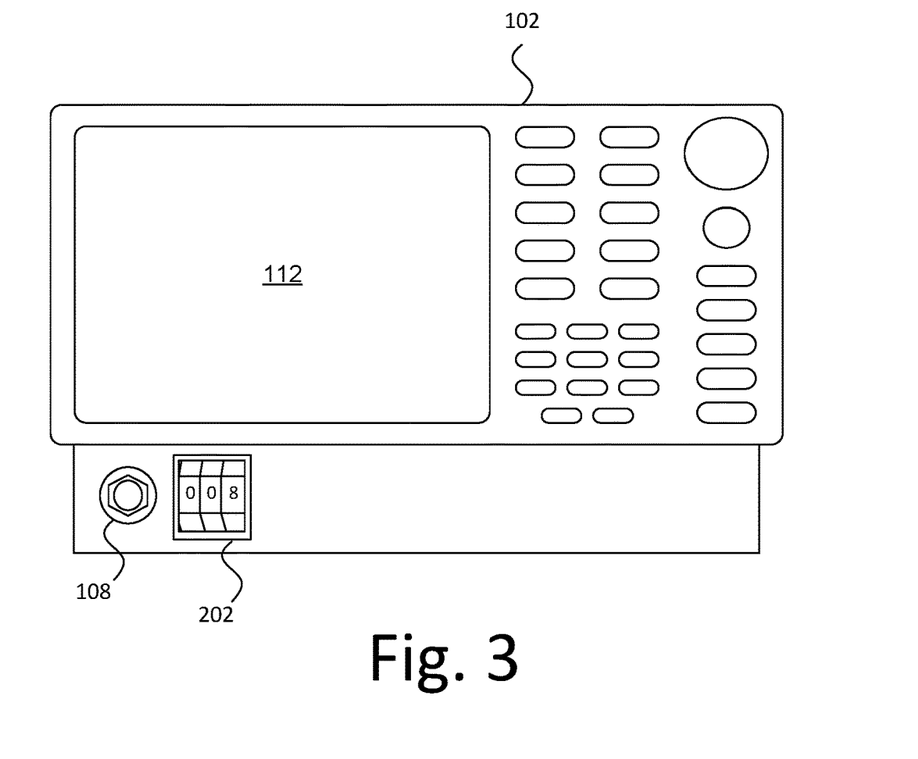
FIG. 3 illustrates an example condition indicator on a device according to some examples of the disclosure.

Alternatively, in some examples, a mechanical condition indicator 202 may be located on the test and measurement instrument 102, rather than on the cable 200 itself, as shown in FIG. 3. The mechanical condition indicator 202 may be located next to the port 108 that the cable 106 is plugged into. Similar to pin 204, a pin (not shown in FIG. 3) may also be provided in the port 108 that can cause the mechanical condition indicator 202 to be updated when the cable 106 is inserted.

In some examples, a sensor may be provided in the test and measurement instrument 102 that causes the condition indicator 202 to update when the cable 106 is inserted into a port. Further, although not shown in FIG. 3, a blocking mechanism similar to blocking mechanism 208 could also be provided within the port 108 to prevent the cable 106 from being plugged in when the condition indicator 202 has reached a certain value, similar to discussed above with respect to FIG. 2. In FIG. 3, the mechanical condition indicator 202 can be reset when a new cable 106 is purchased by a user.

Although the mechanical condition indicator 202 is shown on a test and measurement instrument 102 in FIG. 3, the condition indicator 202 could be provided on any type of device that the cable 106 is plugged into, including a device under test 104.

Figure 4:
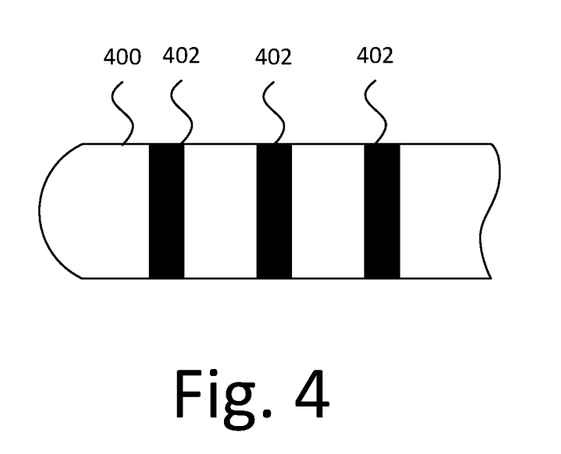
FIG. 4 illustrates a wear indicator on a conductor according to some examples of the disclosure.
Figure 5:
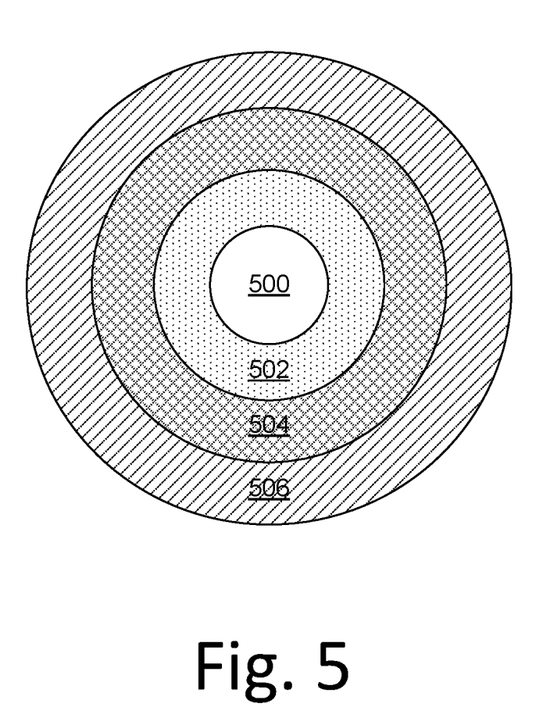
FIG. 5 illustrates a cross-section view of a wear indicator on a conductor according to other examples of the disclosure.

In some examples, a condition indicator may be a wear indicator, as illustrated in FIGS. 4 and 5. FIG. 4 illustrates an end portion of a conductor 400 of a cable connector, such as BNC, plug, or barrel style connectors. However, as will be understood by one skilled in the art, the cable may include additional components, such as sheathing or additional conductors. A single conductor 400 is shown in FIG. 4 for ease of illustration. The conductor 400 may include one or more wear bars 402. In FIG. 3, three wear bars 402 are shown, but as will be understood by one skilled in the art, any number of wear bars may be provided on the conductor 400.

Each wear bar 402 may contain a different composite material that shares similar electrical characteristics of the conductor 400, but has different material characteristics. Some examples of composite materials that may be used are plastics, ceramics, copper alloys, or gold alloys. For example, the first wear bar 402 may wear more quickly, while the last wear bar 402 wears at a slower pace. As the wear bars 402 disappear, a user will be alerted that the cable 106 is nearing end of life. However, the end portion of the conductor 400 would be visible to the user through a connector.

Alternatively, a conductor 500 may be wrapped in a number of different composite materials 502, 504, 506, each composite material having a similar electrical characteristic of the conductor 400, but different material characteristics, as shown in FIG. 5. FIG. 5 illustrates a cross-section view of a conductor 500 coated in three different composite materials 502, 504, and 506. While three materials are shown, examples of the disclosure are not limited to three, and any number of composite materials may be used, such as a single composite material or more than three composite materials. Each material 502, 504, 506 may include a different color. As the cable 106 is repeatedly inserted, the materials 502, 504, and 506 wear off indicating the condition of the cable 106. In some examples, the color may be invisible to a user, such as an infrared paint, but visible to an image capturing device.

As will be understood by one skilled in the art, the cable 106 may have one or more sheathing layers around the one or more conductors 400. In some examples, rather than having a number of different composite materials, one of the sheathing layers of the cable 106 may be wrapped in a polymer that may change color, or provide some other type of visible indicator, when electricity is passed through the polymer. In some examples, the color may be invisible to a user, such as an infrared paint, but visible to an image capturing device.

For example, the polymer may be an electrochromic polymer. The polymer may change colors over a set life as electricity is passed through the polymer. For example, the polymer may change from green to red over 1000 milliamp hours (mAh). Examples of the disclosure are not limited to this set life, and a polymer may be chosen based on the expected life of the cable 106. The polymers can also indicate damage/misuse of the cable 106 from heat (thermochromic), drop, pressure, or fall (peizeochromic), and/or shock damage.

In some examples, the test and measurement system 100 can include an image capturing device (not shown), which can obtain an image of the condition indicator 110 when the condition indicator 110 is a physical condition indicator 110, such as a wear bar, polymer, or mechanical number indicator. The image capturing device can transmit an image of the condition indicator 110 to a processor, which may be located in the test and measurement instrument 112, a cloud, or any other device of the test and measurement system 100.

The processor can analyze the image to determine a color change of the condition indicator 110. For example, if the condition indicator 110 includes infrared paint, the processor can determine the percentage of infrared paint that is visible, the location of the wear of the infrared paint, and other factors that can be converted into a health indicator to the user, as well as predicting when and/or how the cable may fail.

Figure 6:
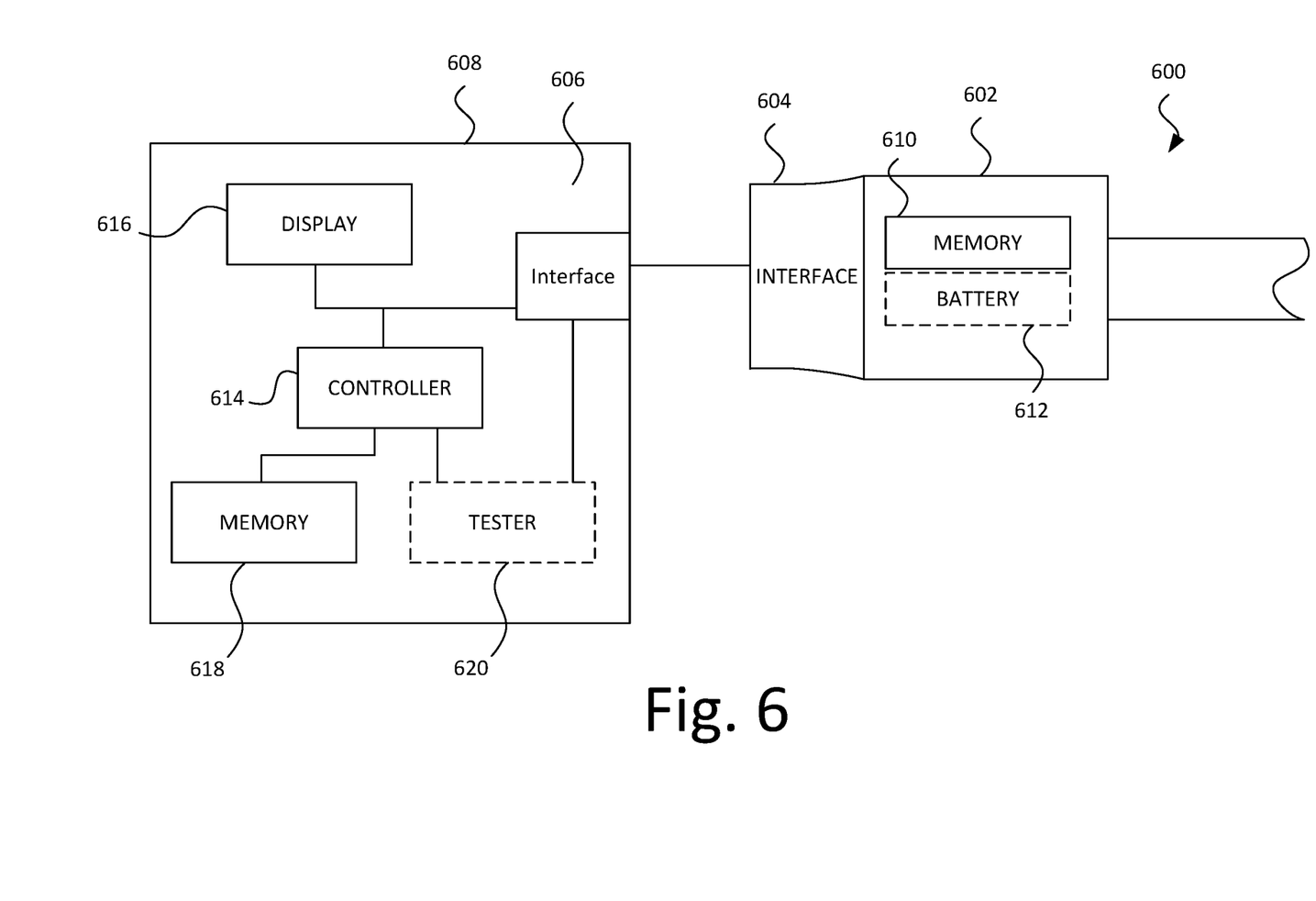
FIG. 6 illustrates a block diagram of a cable, a device, and a condition indicator according to some examples of the disclosure.

FIG. 6 illustrates a block diagram of a test and measurement system according to some examples of the disclosure. A cable 600 can include a connector 602, which may also be referred to as a cable assembly, having an interface 604 that can interact with an interface 606 of a device 608. The interface 606 of the device 600 may be, for example, a port 108, such as shown in FIG. 1.

The connector 602 can include a housing which houses a memory 610, which operates as a condition indicator. In some examples, the housing may also include an optional battery 612. The test and measurement instrument 608 may include a controller 614, a display 616, memory 618, and an optional tester 620. The device 608 may also include additional components not shown, such as, but not limited to, user inputs and additional circuity for operation.

Memory 610 of the connector 602 can be updated each time the interface 604 is plugged into the interface 606. If a battery 612 is not included, then the memory 610 may operate on power provided by the device 608 through the interface 606. In other examples, the battery 612 in the connector 602 operates the memory 610 and the memory 610, whether or not the device 608 has the ability to transfer power to the cable 600 through the interface 606.

The condition indicator or memory 610 can be structured or configured to store information related to the cable 600, such as, but not limited to, a number of power cycles felt or sensed by the cable 600, such as the number of times the cable 600 was plugged in, number of hours in active use state of the cable 600, a condition test result, a device identification in which the cable 600 was last used, a unique identifier of the cable 600, the last operator to use the cable 600, the physical or geographical location of the last device the cable 600 was plugged into, the batch identification number, and/or the production date. Data for the memory may be received through the interfaces 606 and 604 from the device 608, such as from the controller 614.

When plugged into the device 608, the information from the memory 610 may be transmitted through the interfaces 604 and 606 and displayed on the display 616 for a user or transmitted to a remote device for a user to view. In some examples, if the memory 610 includes an indication that the cable is near the end of life, such as if the number of power cycles is over a threshold, or a test of the cable indicates degradation, then the controller 614 may output such an indication to a user on the display 616 or to a remote device. In some examples, the controller 614 may automatically send a message through a transmitter (not shown) to order a new cable through a subscription service.

In some examples, the device 608 may include a tester 620. The tester 620 may output a known electrical signal to the cable 600 through the interface 606. The tester 620 can then measure a response from the cable 600. The tester 620 can cause the display 616 to display the condition of the cable 600 based on the response from the cable 600. The condition may include, for example, an estimated amount of remaining life of the cable 600, the difference in a percentage from a 100% unused cable, etc. The response of the cable 600 can be compared to a reference response for an unused cable. Based on the difference, the controller 614 and/or tester 620 can determine the remaining useful life or condition of the cable 600. The results of the test from the tester 620 may be stored in the memory 618. The results can also be used to recalibrate a parameters of a cable 106 to be in known working order/compliance with test procedures The tester 620 can be engaged through either a user interface (not shown) of the device or by a button or actuator (also known shown) on the device 608. In some examples, a button or actuator on the connector 602 can transmit a signal through the interfaces 604 and 606 which can cause the tester 620 to output the test signal.

When it is determined that the cable 600 is no longer in good condition, either based on the data in the memory 610 or the output of the tester 620, a blocking mechanism, such as blocking mechanism 208 discussed above, may be deployed to prevent the cable 600 from being inserted into the device 608. The blocking mechanism may be any blocking mechanism discussed above that prevents the connection of the cable 600 to the device 608. For example, the blocking mechanism 208 can be a digital blocking mechanism, as mentioned above, in the controller 614 that prevents tests from being run when the cable 602 is detected as damaged or end of life.

Figure 7:
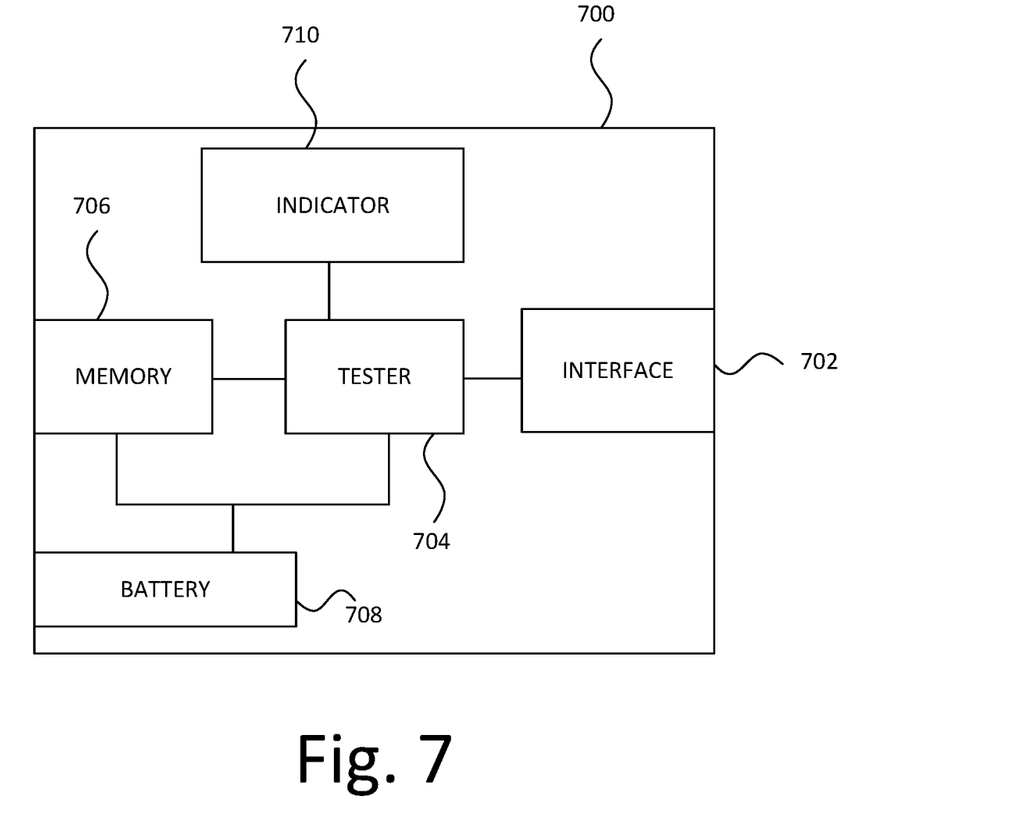
FIG. 7 illustrates a block diagram of a connector with a condition indicator according to some examples of the disclosure.

FIG. 7 is a block diagram or connector 700 of a cable. The cable connector 700 includes an interface 702 that connects to a port of a device. The connector 700 can also include a tester 704, a memory 706, a battery 708, and/or a condition indicator 710.

In the cable connector 700, the cable connector 700 can include a self-tester 704, similar to the tester 620 of FIG. 6. The tester 700 can be engaged by pressing a button or other actuator (not shown) on the connector 700. The tester 700 can output a known electrical pulse (waveform) through the cable and measure the response of the cable to determine a condition of the cable. The tester 700 and/or the condition indicator 710 can include a controller which can compare the response of the cable to the known electrical pulse to a standard. Based on the comparison, the cable indicator 710 can output the condition of the cable.

For example, the cable indicator 710 can output the condition of the cable on a display, such as a small LED display on the cable connector 700. In other examples, the condition indicator 710 can cause a fill bar to engage to show the remaining expected life of the cable. In some examples, the condition indicator 710 can include a color changing material displayed on the connector 700. Based on the output of the tester 704, a specific signal may be sent to the color changing material to cause the material to change color to indicate the life of the cable. In some examples, the color changing material of the condition indicator 710 may only be visible to an image capturing device.

In addition to the tester 704, the memory 706 may store information related to the cable as part of the indicator 710. This information may be passed to a device when the interface 702 is plugged into a device, similar to cable 600 discussed above. The memory 706 may store information such as, but not limited to, the number of times the cable was plugged in, number of hours in active use state of the cable, the device identification in which the cable was last used, a unique identifier of the cable, the last operator to use the cable, the physical or geographical location of the last device the cable was plugged into, the batch identification number, and/or the production date.

Similar to other examples above, when it is determined that the cable 700 is no longer in good condition, either based on the data in the memory 706 or the output of the tester 704, a blocking mechanism, such as blocking mechanism 208 discussed above, may be deployed to prevent the cable 700 from being inserted into a device. The blocking mechanism may be any blocking mechanism discussed above that prevents the connection of the cable 700 to a device.

Any of the above-described condition indicators in FIG. 2 through FIG. 7 can be combined. For example, tester 620 or 704 can be combined with the mechanical indicators shown in FIGS. 2-5 to provide a back-up check of the cable condition. Further, if a device receives information that the cable is near end of life, such as through information stored in memory 610 or memory 706 or through one of the testers 620 or 704, the device can transmit a message either alerting a user to purchase a new cable or automatically purchasing a cable for the user, if the user is part of a subscription service.

The onboard memory 610 or 706 may also be used in some examples for simulation and for traceability reasons for the cable 600 or connector 700. The health of the cable can be stored in the onboard memory 610 or 706 over time, and as the cable goes through its product lifecycle, a processor within the test and measurement system 100 can predict how and/or when the cable may fail based on the health of the cable stored in the onboard memory 610 or 706. Additionally, the processor may be able to predict electrical changes that may occur within the testing due to the health of the cable. Finally, this data may be saved and used to assist with future product enhancements and modifications, betters inputs to simulators for new designs, and a traceability record for use in culpability/root cause analysis if a failure occurs.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 a cable structured to be repeatedly connected to a device, each repeated connection causing degradation of the cable, the cable comprising a condition indicator disposed on the cable and configured to be updated with each successive connection of the cable into the device.

Example 2 is the cable of example 1, further comprising a blocking mechanism configured to prevent the cable from being connected to the device when the condition indicator is greater than a threshold.

Example 3 is the cable of either one of examples 1 or 2, further comprising a connector having a conductor, wherein the condition indicator includes a plurality of layers of composite materials over at least a portion of the conductor, each layer having different material characteristics, and the plurality of layers are worn away with each repeated connection of the cable.

Example 4 is the cable of any one of examples 1-3, wherein the condition indicator includes a number indicator that is adjusted by depressing a pin when the cable is connected to the device.

Example 5 is the cable of any one of examples 1-4, further comprising one or more sheathing layers, wherein the condition indicator includes wrapping one of the one or more sheathing layers in a color-changing polymer.

Example 6 is the cable of any one of examples 1-5, wherein the condition indicator includes a memory.

Example 7 is the cable of example 6, wherein the memory is structured to store at least one of a number of power cycles of the cable, a self-test outcome, number of hours in an active use state, a device identification of the device, a unique identifier, a last operator, a batch identification number, or a production date.

Example 8 is the cable of either one of examples 6 or 7, wherein the condition indicator further includes a battery.

Example 9 is the cable of either one of examples 6 or 7, wherein the memory is powered when the cable is connected to the device.

Example 10 is the cable of any one of examples 1-9, wherein the condition indicator includes a self-tester configured to output a known electrical pulse and measure the condition of the cable.

Example 11 is the cable of any one of examples 1-10, further comprising a tester configured to output a known electrical pulse and determine a condition of the cable based on a cable response to the known electrical pulse.

Example 12 is a test and measurement system, comprising a device; a cable removably connected to the device, each repeated connection of the cable to the device causing degradation of the cable; and a condition indicator configured to indicate a condition of the cable.

Example 13 is the test and measurement system of example 12, further comprising a tester configured to output a known electrical pulse and to cause the condition indicator to indicate the condition of the cable based on a cable response to the known electrical pulse.

Example 14 is the test and measurement system of either one of examples 12 or 13, wherein the condition indicator includes a mechanical condition indicator.

Example 15 is the test and measurement system of any one of examples 12-14, wherein the cable includes a memory.

Example 16 is the test and measurement system of example 15, wherein the memory is configured to store at least one of a number of power cycles of the cable, a self-test outcome, number of hours in an active use state, a device identification of the device, a unique identifier, a last operator, a batch identification number, or a production date.

Example 17 is the test and measurement system of either one of examples 15 or 16, wherein the memory receives data to store related to the cable from the device.

Example 18 is a test and measurement cable structured to be repeatedly connected to a device, each repeated connection causing degradation of the test and measurement cable, the test and measurement cable comprising a self-tester configured to output a known electrical pulse and measure a response based on the known electrical pulse; and a condition indicator configured to output a condition based at least in part on the measured response.

Example 19 is the test and measurement cable of example 18, further comprising a battery.

Example 20 is the test and measurement cable of example 19, wherein the condition indicator includes a display or a color changing material.

Example 21 is the method for indicating the wear of a cable, comprising removably connecting a cable to a device, each repeated connection of the cable to the device causing degradation of the cable; and indicating a condition of the cable based on each repeated connection of the cable.

Example 22 is the method of example 21, further comprising, preventing the cable from being connected to the device when the condition indicator is greater than a threshold.

Example 23 is the method of either one of examples 21 or 22, further comprising storing in a memory at least one of a number of power cycles of the cable, a self-test outcome, number of hours in an active use state, a device identification of the device, a unique identifier, a last operator, a batch identification number, or a production date.

Example 24 is the method of any one of examples 21-23, further comprising outputting a known electrical pulse to test the cable; and measuring the condition of the cable based on the known electrical pulse.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A cable structured to be repeatedly connected to a device, each repeated connection causing degradation of the cable, the cable comprising a condition indicator disposed on the cable and configured to be updated with each successive connection of the cable into the device.

2. The cable of claim 1, further comprising a blocking mechanism configured to prevent the cable from being connected to the device when the condition indicator is greater than a threshold.

3. The cable of claim 1, further comprising a connector having a conductor, wherein the condition indicator includes a plurality of layers of composite materials over at least a portion of the conductor, each layer having different material characteristics, and the plurality of layers are worn away with each repeated connection of the cable.

4. The cable of claim 1, wherein the condition indicator includes a number indicator that is adjusted by depressing a pin when the cable is connected to the device.

5. The cable of claim 1, further comprising one or more sheathing layers, wherein the condition indicator includes wrapping one of the one or more sheathing layers in a color-changing polymer.

6. The cable of claim 1, wherein the condition indicator includes a memory.

7. The cable of claim 6, wherein the memory is structured to store at least one of a number of power cycles of the cable, a self-test outcome, number of hours in an active use state, a device identification of the device, a unique identifier, a last operator, a batch identification number, or a production date.

8. The cable of claim 6, wherein the condition indicator further includes a battery.

9. The cable of claim 6, wherein the memory is powered when the cable is connected to the device.

10. The cable of claim 1, wherein the condition indicator includes a self-tester configured to output a known electrical pulse and measure a condition of the cable.

11. The cable of claim 1, further comprising a tester configured to output a known electrical response pulse and determine a condition of the cable based on the known electrical response pulse.

12. A test and measurement system, comprising:
a device;
a cable removably connected to the device, each repeated connection of the cable to the device causing degradation of the cable; and
a condition indicator configured to indicate a condition of the cable and configured to be updated with each successive connection of the cable into the device.

13. The test and measurement system of claim 12, further comprising a tester configured to output a known electrical pulse and to cause the condition indicator to indicate the condition of the cable based on the known electrical pulse.

14. The test and measurement system of claim 12, wherein the condition indicator includes a mechanical condition indicator.

15. The test and measurement system of claim 12, wherein the cable includes a memory.

16. The test and measurement system of claim 15, wherein the memory is configured to store at least one of a number of power cycles of the cable, a self-test outcome, number of hours in an active use state, a device identification of the device, a unique identifier, a last operator, a batch identification number, or a production date.

17. The test and measurement system of claim 15, wherein the memory receives data to store related to the cable from the device.

18. A test and measurement cable structured to be repeatedly connected to a device, each repeated connection causing degradation of the test and measurement cable, the test and measurement cable comprising:
a self-tester configured to output a known electrical pulse and measure a response based on the known electrical pulse; and
a condition indicator configured to be updated with each successive connection of the test and measurement cable into the device and to output a condition based at least in part on the measured response.

19. The test and measurement cable of claim 18, further comprising a battery.

20. The test and measurement cable of claim 19, wherein the condition indicator includes a display or a color changing material.

21. A method for indicating wear of a cable, comprising:
removably connecting a cable to a device, each repeated connection of the cable to the device causing degradation of the cable;
indicating a condition of the cable based on each repeated connection of the cable; and
updating a condition indicator with each successive connection of the cable into the device.

22. The method of claim 21, further comprising, preventing the cable from being connected to the device when the condition indicator is greater than a threshold.

23. The method of claim 21, further comprising storing in a memory at least one of a number of power cycles of the cable, a self-test outcome, number of hours in an active use state, a device identification of the device, a unique identifier, a last operator, a batch identification number, or a production date.

24. The method of claim 21, further comprising:
outputting a known electrical pulse to test the cable; and
measuring the condition of the cable based on the known electrical pulse.

* * * * *